United States Patent
Stroet

(10) Patent No.: US 8,901,988 B2
(45) Date of Patent: Dec. 2, 2014

(54) BALUN MIXER CIRCUITS

(71) Applicant: Linear Technology Corporation, Milpitas, CA (US)

(72) Inventor: Petrus M. Stroet, Santa Cruz, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/061,479

(22) Filed: Oct. 23, 2013

(65) Prior Publication Data

US 2014/0312955 A1    Oct. 23, 2014

Related U.S. Application Data

(60) Provisional application No. 61/813,583, filed on Apr. 18, 2013.

(51) Int. Cl.
*G06G 7/12* (2006.01)
*G06F 7/44* (2006.01)
*H03D 7/14* (2006.01)

(52) U.S. Cl.
CPC .................................. *H03D 7/1425* (2013.01)

USPC ............................ 327/355; 455/323; 455/326

(58) Field of Classification Search
USPC ............................ 327/355–361; 455/323, 326
See application file for complete search history.

(56) References Cited

U.S. PATENT DOCUMENTS

| 4,768,000 | A | * | 8/1988 | Pavio et al. | 332/170 |
| 6,959,180 | B2 | | 10/2005 | Ji | |
| 7,308,244 | B2 | | 12/2007 | Chang et al. | |
| 7,420,423 | B2 | * | 9/2008 | Lee et al. | 330/301 |
| 7,890,076 | B2 | * | 2/2011 | Mattisson et al. | 455/323 |
| 8,050,644 | B1 | * | 11/2011 | Cosand et al. | 455/295 |

* cited by examiner

*Primary Examiner* — Dinh Le
(74) *Attorney, Agent, or Firm* — Edward C. Kwok; Hogan Lovells US LLP

(57) ABSTRACT

A single-balanced balun mixer circuit includes a balun with a center tap connected to a differential pair with a tail resistor. The balun receives a first input signal and a second signal at the single-ended input terminal and the center tap, respectively. Such a balun mixer may be used as an up-converter mixer by supplying a baseband or intermediate signal at the center tap and a local oscillator (LO) signal at the single-ended input terminal.

9 Claims, 6 Drawing Sheets

BALUN MIXER (SINGLE-BALANCED)

BALUN MIXER (SINGLE-BALANCED)

GILBERT CELL MIXER (DOUBLE-BALANCED)

BALUN MIXER (DOUBLE-BALANCED)

BALUN MIXER (DOUBLE-BALANCED IMAGE-REJECT)

BALUN MIXER (DOUBLE-BALANCED IMAGE-REJECT) WITH MIXER CORE BLOCKS

BALUN MIXER CIRCUITS

CROSS REFERENCE TO RELATED APPLICATIONS

The present application is related to and claims priority of U.S. provisional patent application ("Provisional Application"), Ser. No. 61/813,583, entitled "Balun Mixer Circuits", filed on Apr. 18, 2013. The Provisional Application is hereby incorporated by reference in its entirety.

BACKGROUND OF THE INVENTION

1. Field of the Invention

The present invention relates to analog signal processing. In particular, the present invention relates to analog mixers, such as those used for up-conversion of a baseband signal.

2. Discussion of the Related Art

One mixer circuit known in the prior art is the Gilbert cell mixer, such as Gilbert cell mixer 200 shown in FIG. 2. As shown in FIG. 2, Gilbert cell 200 includes differential pairs formed, respectively, by NPN transistors Q1 and Q2 and NPN transistors Q3 and Q4, a voltage-to-current conversion stage formed by NPN transistors Q5 and Q6 and resistors Rp and Rm, and a tail current source formed by NPN transistor Q7 and resistor Rb. Gilbert cell mixer 200 suffers from a relatively high power supply voltage requirement and noise from NPN transistors Q5 and Q6 used in the voltage-to-current conversion stage.

U.S. Pat. No. 7,308,244 to Chang et al. ("Chang") discloses a low voltage mixer. Specifically, at FIG. 3 of Chang, Chang discloses a mixer with reduced voltage headroom. Chang does not disclose generating quadrature signals from a passive circuit.

U.S. Pat. No. 6,959,180 to Ji ("Ji") discloses a mixer with a low temperature co-fired ceramic (LTCC) structure.

SUMMARY

According to one embodiment of the present invention, a single-balanced balun mixer circuit includes a balun with a center tap connected to a differential pair with a tail resistor. The balun receives a first input signal and a second signal at the single-ended input terminal and the center tap, respectively. A balun mixer of the present invention may be used as an up-converter mixer by supplying a baseband or intermediate signal at the center tap and a local oscillator (LO) signal at the single-ended input terminal.

According to one embodiment of the present invention, a double-balanced balun mixer circuit may be formed out of two single-balanced balun mixer circuits. In a double-balanced balun mixer circuit, the center tap terminals receive a baseband differential signal.

According to one embodiment of the present invention, a double-balanced image-reject mixer circuit may be formed out of two double-balanced balun mixer circuits, with the component double-balanced balun mixer circuits receiving the inphase and quadrature channels of the respective LO signals and baseband differential signals, respectively.

According to one embodiment of the present invention a passive LO chain may be provided to generate quadrature signals of the local oscillator. Polyphase filters may also be provided in the balun circuits.

The advantages of a balun mixer circuit of the present invention include low-voltage, low-power operations and low noise. Unlike the Gilbert cell mixer of the prior art, a balun mixer of the present invention does not require a separate voltage-to-current conversion stage.

The present invention is better understood upon consideration of the detailed description below, in conjunction with the drawings.

BRIEF DESCRIPTION OF THE DRAWINGS

FIG. 6 shows passive LO chain 650, which is connected to circuit blocks 501a and 501b of FIG. 5 (omitted from FIG. 6) via input signals IPP, IPM, IMP, IMM, QPP, QPM, QMP and QMM, circuit blocks 501a and 501b providing output signals RF out 103a and 103b (see FIG. 5).

For convenience of comparing elements between figures, like elements in the figures are assigned like reference numerals.

DETAILED DESCRIPTION OF THE PREFERRED EMBODIMENTS

Figure 1:
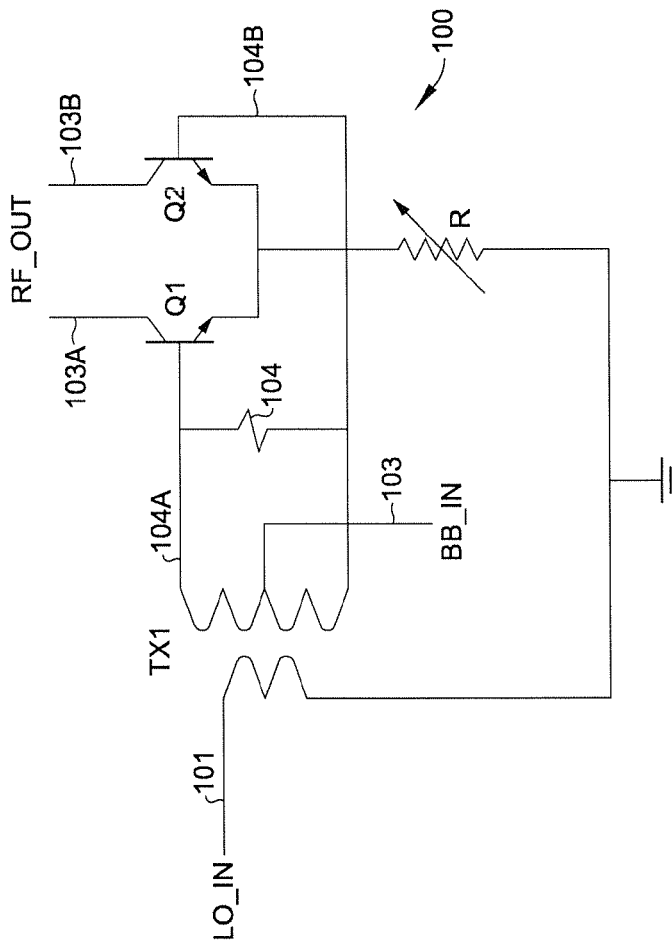
FIG. 1 shows balun mixer 100, in accordance with one embodiment of the present invention.
Figure 2:
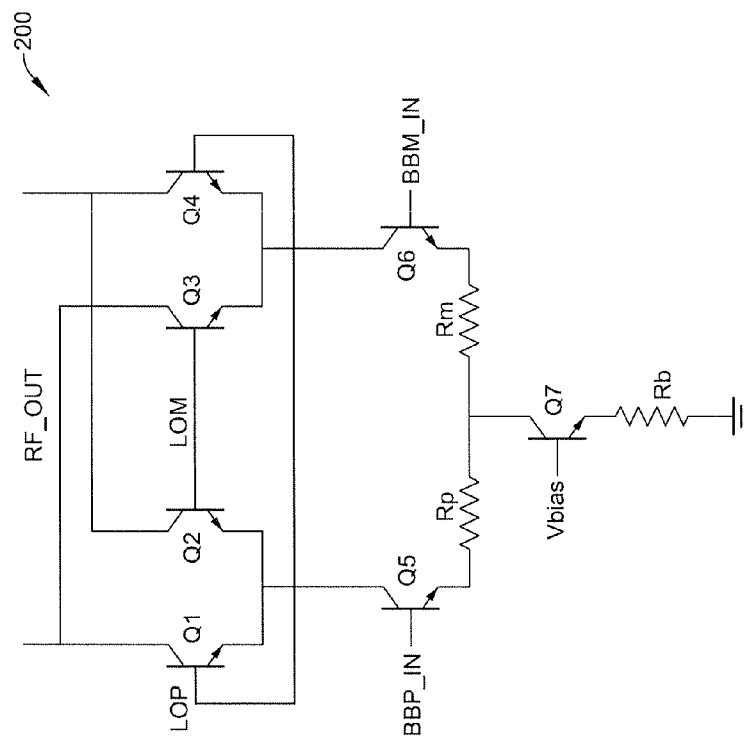
FIG. 2 shows Gilbert cell mixer 200 in the prior art.

FIG. 1 shows balun mixer 100, in accordance with one embodiment of the present invention. As shown in FIG. 1, balun mixer 100 includes balun TX1 receiving, at its single-ended input terminal, a local oscillator (LO) signal LO_in and, at its center tap, baseband signal BB_in. The balanced output signals of balun TX1 are provided to the base terminals of NPN transistors Q1 and Q2, which form a differential pair with tail resistor R. Resistor R is preferably a variable resistor, so that the mixer gain can be varied, as appropriate. The resistance may be varied either in digital steps (e.g., similar to a programmable gain amplifier (PGA)), or continuously (e.g., similar to a variable gain amplifier (VGA)). Furthermore, the differential output terminals 104a and 104b of balun TX1 can be shunted by termination resistor 104 of appropriate resistance to provide a good input impedance to the LO port.

One advantage of balun mixer circuit 100 is its low voltage operation. As shown in FIG. 1, balun mixer circuit 100 can operate down to a base-emitter voltage ($V_{be}$, approximately 0.7V) plus a peak signal swing ($V_p$, e.g., 0.3V). Thus, balun mixer circuit 100 may operate at a minimum voltage of 1 volt. Further, if the NPN bipolar transistors are replaced by MOSFETS, the operating voltage may even be reduced further, as the threshold voltages for MOSFETs, under modern processes, may even be significant lower than 0.7V.

Figure 3:
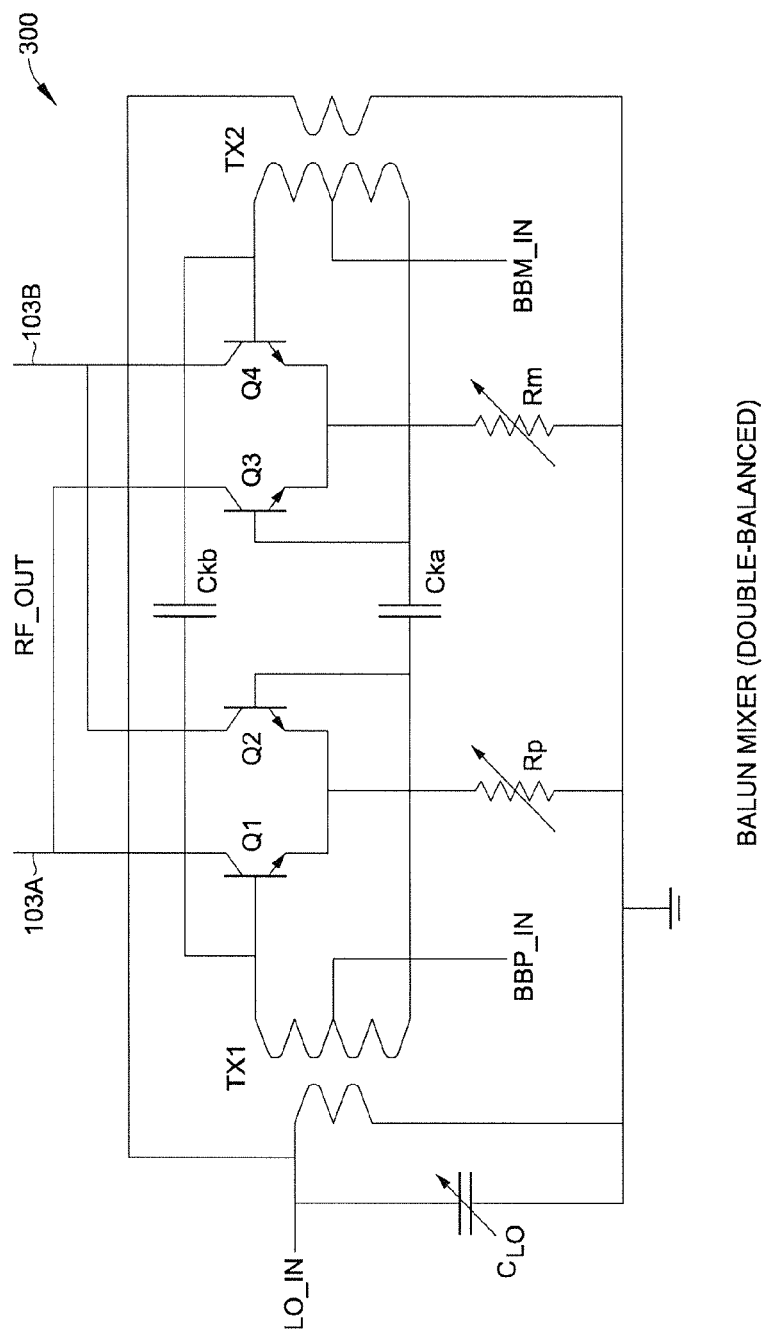
FIG. 3 shows balun mixer circuit 300 having a double-balanced configuration, accordance with one embodiment of the present invention.

To reduce the relatively strong LO signal content at the RF output terminals 103a and 103b, balun mixer circuit 300, such as shown in FIG. 3, may be used. Balun mixer circuit 300 has a double-balanced configuration that suppresses the LO signal content in output terminals 103a and 103b. As shown in FIG. 3, parallel-connected baluns TX1 and TX2 receive signal LO_in at their common single-ended terminals, and at their respective center taps the differential baseband signal BBP_in and BBN_in. The balanced output signals of baluns TX1 and TX2 drive the differential pair formed by NPN transistors Q1 and Q2 and variable resistors Rp, and the differential pair formed by NPN transistors Q3 and Q4 and variable resistors Rm. Coupling capacitor Cka provides "neutrodynization" of the collector-base junction capacitances ("$C_\mu$") in NPN transistors Q2 and Q3. Similarly, coupling capacitor Ckb provides neutrodynization of in $C_\mu$ NPN transistors Q1 and Q4. As a result, by providing better isolation between the LO ports and the RF ports, coupling capacitors Cka and Ckb reduce LO leakage of the LO signal to RF terminals 103a and 103b and improve mixer linearity.

In FIG. 3, variable $C_{LO}$ may be provided at the LO port. The additional capacitance allows lower frequency operation by signal LO_in. If the circuits operate at a high LO frequency, capacitance in capacitor $C_{LO}$ can be reduced for better performance.

Figure 4:
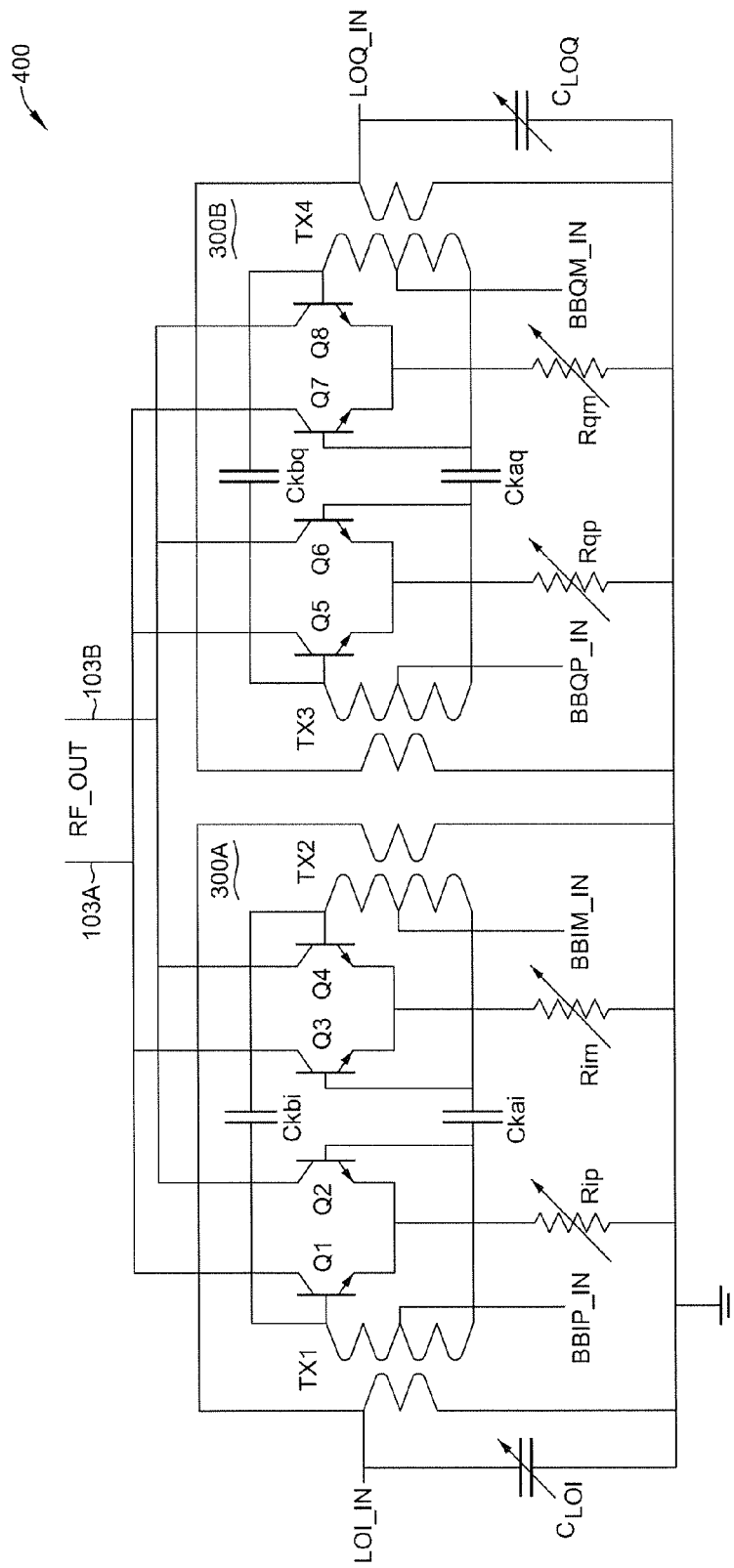
FIG. 4 shows balun mixer circuit 400 built out of two copies of double-balanced balun mixer circuit 300 of FIG. 3, in accordance with one embodiment of the present invention.

FIG. 4 shows balun mixer circuit 400 built out of two copies of double-balanced balun mixer circuit 300 of FIG. 3, in accordance with one embodiment of the present invention. Balun mixer circuit 400 is a double-balanced image-reject mixer. As shown in FIG. 4, balun mixer circuit 400 is formed out of double-balanced mixer circuits 300a and 300b, each configured in the manner of balanced balun mixer circuit 300 of FIG. 3. Balun mixer circuit 400 receives LO inphase and quadrature signals LOI_in and LOQ_in (90° phase separation) in at the singled-ended input terminals of balun mixer circuits 300a and 300b. Specifically, inphase signal LOI_in is received at the single-ended input terminal of baluns TX1 and TX2, quadrature signal LOQ_in is received at the single-ended input terminal of baluns TX3 and TX4. The inphase and quadrature differential baseband signals, BBIP_in, BBIM_in, BBQP_in and BBQM_in, respectively are provided to the center taps of baluns TX1, TX2, TX3, and TX4, respectively. By varying the resistances of variable resistors Rip, Rim, Rqp and Rqm simultaneously, the gain in balun mixer circuit 400 may be varied. Specifically, the gain in the inphase signals ("I-gain") may be achieved by varying the resistances in variable resistors Rip and Rim, and the gain in the quadrature signals ("Q-gain") may be achieved by varying the resistances of variable resistors Rqp and Rqm. Furthermore, the I-gain and the Q-gain may be adjusted relative to each other to correct I/Q gain error for improved sideband suppression. LO leakage at the RF output terminals 103a and 103b caused by (i) DC offsets in the I-channel or the Q-channel, (ii) direct LO feedthrough, or (iii) any combination of these factors, can be minimized by changing the ratio of resistors Rip and Rim and the ratio of resistors Rqp and Rqm.

Figure 5:
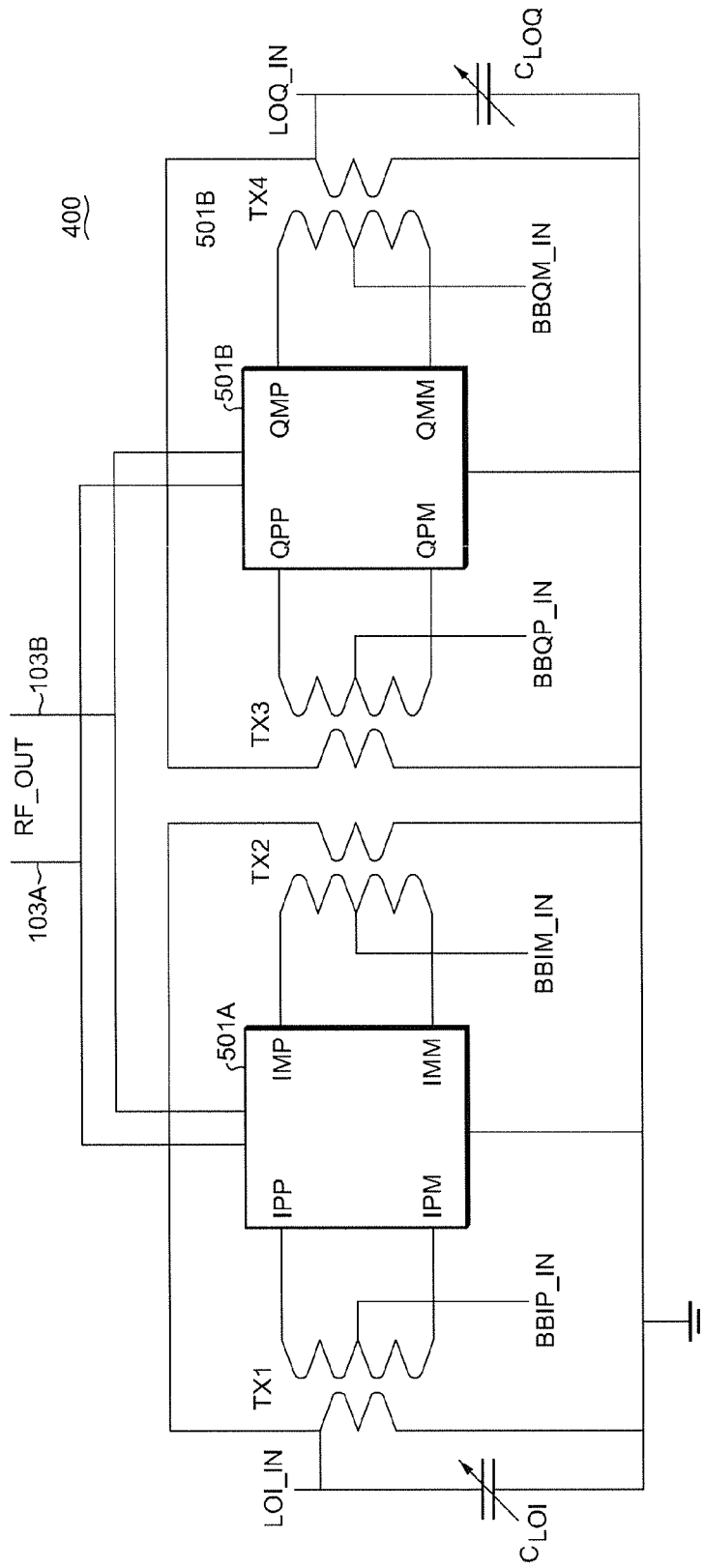
FIG. 5 is a schematic representation of double-balanced image-reject mixer 400, with the core of balanced balun mixer circuits 300a and 300b represented by circuit blocks 501a and 501b.

FIG. 5 is a schematic representation of double-balanced image-reject mixer 400, with the core of balanced balun mixer circuits 300a and 300b (i.e., the differential pairs, the variable resistors and the coupling capacitors) represented by circuit blocks 501a and 501b for simplicity.

Figure 6:
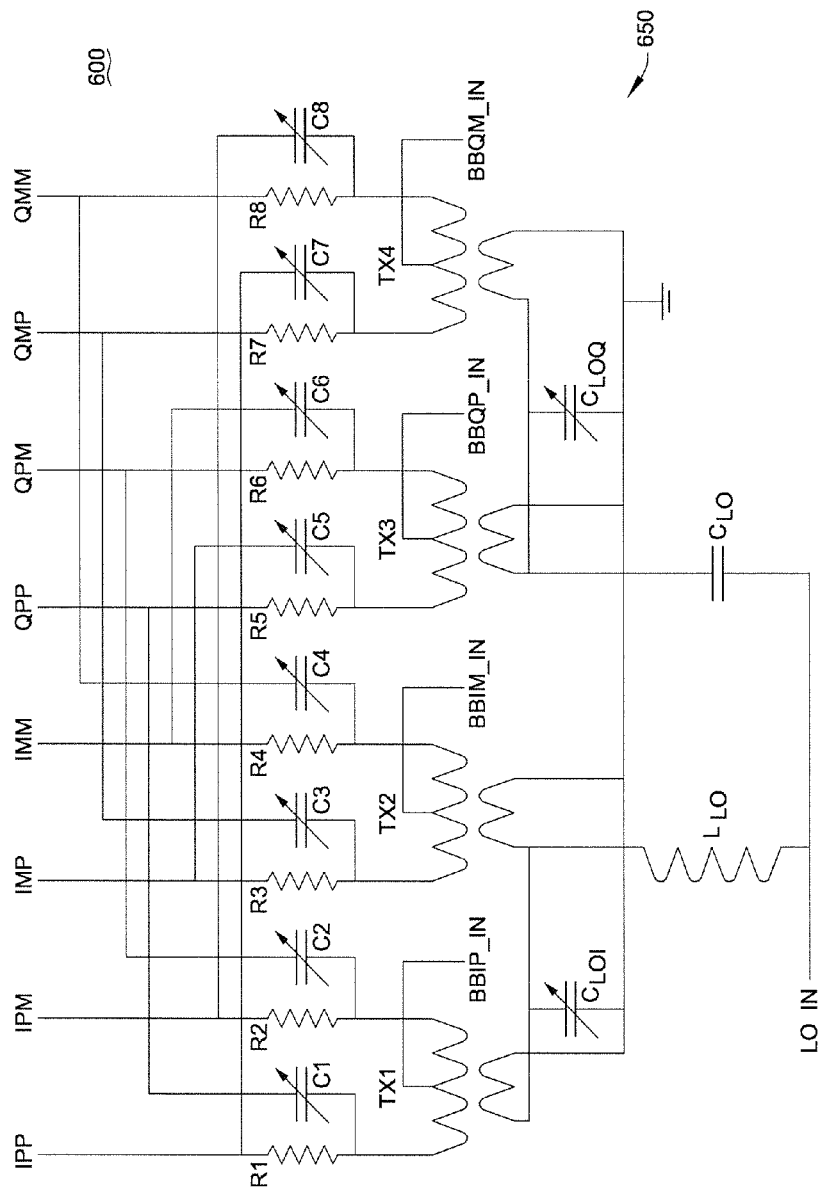
FIG. 6 shows a part of double-balanced image reject balun mixer 600, in accordance with one embodiment of the present invention; in particular.

FIG. 6 shows a part of double-balanced image reject balun mixer 600, in accordance with one embodiment of the present invention. In particular, FIG. 6 shows passive LO chain 650, which is connected to circuit blocks 501a and 501b of FIG. 5 (omitted from FIG. 6) via input signals IPP, IPM, IMP, IMM, QPP, QPM, QMP and QMM, circuit blocks 501a and 501b providing output signals RF out 103a and 103b (see FIG. 5). In FIG. 6, signals IPP, IPM, IMP, IMM, QPP, QPM, QMP and QMM are the input terminals to the core circuits 501a and 501b of balun mixer 600. It is understood that core circuits 501a and 501b of FIG. 5 are part of double-balanced image reject balun mixer 600, but are omitted from FIG. 6 to avoid clutter. LO chain 650 includes poly-phase RC filters formed by resistors R1 to R8 and variable capacitors C1 to C8. In one embodiment, resistors R1 to R8 each have the same resistance and variable capacitors C1 to C8 each have the same capacitance. In one embodiment, variable capacitors are tunable in a binary weighted fashion, being provided as an array of MOS capacitors or as an array of capacitors in series with MOS switches. Capacitors C1 to C8 allow the LO frequency that provides the quadrature signals be varied, so as image rejection may be maximized at a specific LO frequency. Inductor $L_{LO}$ and capacitor $C_{LO}$ form a simple diplexer circuit that generates quadrature signals from a single-ended LO input signal of a specific frequency. Although inductor L_LO and capacitor C_LO may be a fixed-value, the quality of the generated quadrature LO signals is mainly determined by the poly-phase filter formed by resistors R1 to R8 and capacitors C1 to C8 since they can be made more accurately using factory trimming and set to the desired LO frequency without changing hardware. However, to improve monotonicity, it is preferable only to have either the capacitors variable or the resistors variable, but not both.

In the connections shown in FIG. 6, the capacitive loading induced by the double poly-phase filters of resistors R1 to R8 and capacitors C1 to C8 on the baseband signals are equalized, as seen from the baseband input signals. There are only four possible combinations of connections where this capacitive load balancing at the baseband signals is achieved together with the correct quadrature phase.

As compared to Chang discussed above, the present invention achieves better noise performance and better DC matching performance—thereby resulting in lower LO leakage—as the DC impedance of the secondary windings in the transformers are significantly lower than, for example, the resistors R1 to R4 in Chang's FIG. 3. The lower DC impedance lowers the impact of the base current mismatch in NPN transistors Q1 to Q4 and the resistor thermal noise. Further, as shown in FIG. 6 and discussed above, the mixers of the present invention generates quadrature LO signals from a single-ended LO input using a passive circuit.

The detailed description above is provided to illustrate specific embodiments of the present invention and is not intended to be limiting. Numerous modifications and variations within the scope of the present invention are possible. The present invention is set forth in the accompanying claims.

I claim:

1. A mixer circuit for mixing a local oscillator signal and a baseband signal, comprising:
    a balun having a single-ended input terminal and a center tap input terminal, the balun providing balanced output signals wherein the local oscillator signal is provided at the single-ended input terminal and the baseband signal is provided at the center tap input terminal; and
    a differential pair including a first transistor and a second transistor and a tail resistor coupled to the first and second transistors, wherein the balanced output signals are provided to the control terminals of the first and second transistors.

2. The mixer circuit of claim 1, wherein the tail resistor comprises a resistor of variable resistance.

3. The mixer of claim 1, further comprising:
    a second balun having a single-ended input terminal coupled to the single-ended terminal of the first balun, and a center tap input terminal, the balun providing balanced output signals, wherein the baseband signal is a differential signal, the differential signal being provided across the center tap input terminal of the first balun and the center tap input terminal of the second balun, and wherein the local oscillator signal is being provided to the single-ended terminal of the second balun;

a second differential pair including a first transistor and a second transistor and a tail resistor coupled to the first and second transistors; and coupling capacitors provided across balanced output terminals of the first balun and the second balun, wherein the balanced output signals of the second balun are provided to control terminals of the transistors of the second differential pair, thereby the mixer providing a double-balanced balun mixer.

4. The mixer of claim 3, further comprising a second double-balanced mixer substantially configured in the same manner as the first double-balanced mixer, wherein the single-ended terminals in the first double-balanced balun mixer and the single-ended terminals in the second double-balanced balun mixer receive inphase and quadrature signals of the local oscillator, and wherein the center tap input terminals of the first double-balanced balun mixer and the center tap input terminals of the second double-balanced balun mixer receive, respectively, the inphase and quadrature differential signals of the baseband signal.

5. The mixer of claim 1, further comprising an inductor and a capacitor forming a LC filter to provide the inphase and quadrature signals of the local oscillator.

6. The mixer of claim 5, further comprising polyphase filters provided between the balanced output terminals of the baluns and the control terminals of transistors of the corresponding differential pairs.

7. The mixer of claim 6, wherein the polyphase filters comprise resistors and capacitors.

8. The mixer of claim 7, wherein the resistors of the polyphase filters comprise resistors of variable resistance.

9. The mixer of claim 7, wherein the capacitors of the polyphase filters comprise capacitors of variable capacitance.

* * * * *